United States Patent [19]

Ishikawa et al.

[11] Patent Number: 4,972,348
[45] Date of Patent: Nov. 20, 1990

[54] OPTO-ELECTRIC HYBRID ASSOCIATIVE MEMORY

[75] Inventors: Masatoshi Ishikawa, Ibaraki; Naohisa Mukohzaka, Shizouka, both of Japan

[73] Assignees: Agency of Industrial Science and Technology, Tokyo; Hamamatsu Photonics K.K., Shizuoka, both of Japan

[21] Appl. No.: 196,644

[22] Filed: May 20, 1988

[30] Foreign Application Priority Data

May 25, 1987 [JP] Japan ................. 62-127865

[51] Int. Cl.$^5$ .............................................. G11C 15/00
[52] U.S. Cl. ...................................... 365/49; 365/215; 364/900; 382/42
[58] Field of Search ................................ 365/49, 215; 364/200 MS File, 900 MS File; 382/14, 15, 42; 381/43

[56] References Cited

U.S. PATENT DOCUMENTS

| | | | |
|---|---|---|---|
| 3,492,652 | 1/1970 | Van Heerden ................... | 365/49 |
| 3,766,533 | 10/1973 | Black et al. ..................... | 365/49 |
| 3,868,655 | 2/1975 | Filippazzi ....................... | 365/49 |
| 4,017,853 | 4/1977 | Brandao et al. ................ | 343/5 DP |
| 4,325,257 | 4/1982 | Kino et al. ..................... | 73/626 |
| 4,446,425 | 5/1984 | Valdmanis et al. ............. | 324/77 K |
| 4,449,193 | 5/1984 | Tournois ......................... | 364/604 |
| 4,603,293 | 7/1986 | Mourou et al. ................. | 324/96 |
| 4,618,819 | 10/1986 | Mourou et al. ................. | 324/77 K |
| 4,651,293 | 3/1987 | Kato ............................... | 364/602 |
| 4,701,879 | 10/1987 | Scarr ............................... | 365/49 |
| 4,739,496 | 4/1988 | Marom et al. .................. | 365/125 |
| 4,748,674 | 5/1988 | Freeman ......................... | 382/15 |
| 4,750,153 | 6/1988 | Owechko et al. ............... | 365/125 |

FOREIGN PATENT DOCUMENTS 0197196 10/1986 European Pat. Off. .

OTHER PUBLICATIONS

"Subpicosecond Electrooptic Sampling: Principles and Applications" by Valdmanis et al., IEEE Jnl. of Quantum Elec., vol. QE-22, No. 1, Jan. 1986, pp. 69-78.
"Picosecond Electro-Optic Sampling System" by Valdmanis et al., Appl. Phys. Lett. 41(3), 1 Aug. 1982, pp. 211-212.
"Subpicosecond Electrical Sampling" by Valdmanis et al., IEEE Jnl. of Quantum Elec., vol. QE-19, No. 4, Apr. 1983, pp. 664-667.
"Electro-Optic Sampling with Picosecond Resolution" by Kolner et al., Electronics Letters, 21st Jul. 1983, vol. 19, No. 15, pp. 574-575.
"Advances in Streak Camera Instrumentation for the Studsy of Biological and Physical Processes" by Tsuchiya, IEEE Jnl. of Quantum Electronics, vol. QE-20, No. 12, Dec. 1974, pp. 1516-1528.
"High-Speed Optical Electronics: The Picosecond Optical Oscilloscope" by Valdmanis, Solid State Technology/Test & Measurement World, Nov. 1986, pp. 540-544.

(List continued on next page.)

Primary Examiner—Glenn Gossage
Attorney, Agent, or Firm—Finnegan, Henderson, Farabow, Garrett, and Dunner

[57] ABSTRACT

An opto-electric hybrid associative memory and corresponding storage and retrieval method employs a pair of spatial light modulators in tandem with polarization analyzer arrangements providing optical multiplication and employs multiple conversions between $n \times n$ matrices and $n^2 \times n^2$ matrices, with the aid of a digital computer and a parallel analog processing circuit, to perform repetitive electrical correlation and conversion operations. Serial scanning of the optical patterns is avoided because the spatial light modulators employ photocathodes, microchannel plates and Pockels cells having back surfaces that are optically-reflective electrical-charge-storing surfaces of long retention capabilities. Repetitive cycling of reference patterns through the memory/method tend to restore missing portions of data.

10 Claims, 3 Drawing Sheets

OTHER PUBLICATIONS

"Electro-Optic Sampling: Testing Picosecond Electronics Part 1. Principles and Embodiments" by Valdmanis et al., Laser Focus/Electro-Optics, Feb. 1986, pp. 84-96.

"Electro-Optic Sampling: Testing Picosecond Electronics Part 2, Applications" by Vladmanis et al, Laser Focus/Electro-Optics, Mar. 1986, pp. 96-106.

"Subpicosecond Electrical Sampling and Applications" by Valdmanis et al., Picosecond Optoelectronic Devices, 1984, pp. 249-270.

"Picosecond Electro-Electron Optic Oscilloscope" by Williamson et al., Proc. Conf. Picosecond Electron. Optoelectron. (N.Y. Springer-Verlag, 1985), pp. 58-61.

"Electrooptic Samping in GaAs Integrated Circuits" by Kolneret et al., IEEE Jnl. of Quantum Electronics, vol. QE-22, No. 1, Jan. 1986, pp. 79, 93.

"Noncontact Electro-Optic Sampling with a GaAs Injection Laser" by Nees et al., Electronics Letters, 14th Aug. 1986, vol. 22, No. 17, pp. 918-919.

Commonly assigned copending patent application U.S. Ser. No. 07/203,909 (Attorney Docket No. NGB-585) filed on Jun. 8, 1988.

OPTO-ELECTRIC HYBRID ASSOCIATIVE MEMORY

FIELD OF THE INVENTION

The present invention relates to an opto-electric hybrid associative memory.

BACKGROUND OF THE INVENTION

Conventional memories used in computers generally employ a method in which information stored in a memory is accessed by specifying the address corresponding to the location of the information in the memory. This type of memory device has a disadvantage in that data previously stored at a location may not be recovered once new information has been stored at the location. To solve this problem, associative memories have been developed wherein information is stored and searched on the basis of a reference input supplied from the outside. The reference input comprises part of the information stored or to be stored and all entries in the memory can be searched in one clock cycle.

Many associative memories have been developed and used as part of a computer memory, and are intended for storing electric digital signals. A scanning operation is necessitated when pattern information is involved, and this requires a much longer time in processing the data. It has been impossible to obtain outputs successively.

SUMMARY OF THE INVENTION

An object of the present invention is to solve the above-mentioned drawbacks of associative memories.

Another object of the present invention is an opto-electric hybrid associative memory in which processing data by optical operations permits a shorter processing time and the generation of successive outputs.

These and other objects are achieved by an opto-electric hybrid associative memory comprising a reference pattern input device for receiving and transmitting an electrical reference pattern in the form of an $n \times n$ matrix, a correlation matrix operation device for converting an electrical pattern in the form of an $n \times n$ matrix from at least said reference pattern input device into an electrical correlation matrix pattern in the form of an $n^2 \times n^2$ matrix, a correlation matrix display device for converting the electrical correlation matrix pattern into an optical correlation matrix pattern in the form of an $n^2 \times n^2$ matrix, a correlation matrix storage device for storing the optical correlation matrix pattern displayed by the correlation matrix display device, a reference pattern conversion device for converting the electrical reference pattern in the form of an $n \times n$ matrix from the reference pattern input device into an electrical reference pattern in the form of an $n^2 \times n^2$ matrix, a reference pattern display device for converting the electrical reference pattern in the form of an $n^2 \times n^2$ matrix from the reference pattern conversion device into an optical reference pattern in the form of an $n^2 \times n^2$ matrix, a pattern operation device for producing an optical recall pattern in the form of an $n^2 \times n^2$ matrix by multiplying the optical correlation matrix pattern from the correlation matrix storage device and the optical reference pattern output from the reference pattern display device by superimposing the one pattern upon the other as a depolarized optical reflection from an optically induced charge pattern, with subsequent polarization analysis, a light receiving matrix for converting the optical recall pattern from the pattern operation device into an electrical recall pattern in the form of an $n^2 \times n^2$ matrix, and a recall pattern conversion device for converting the electrical recall pattern from the light receiving matrix into the electrical recall pattern in the form of an $n \times n$ matrix whereby the recall pattern is obtained from the reference pattern after learning with a plurality of reference patterns through repeated optical processing.

BRIEF DESCRIPTION OF THE DRAWINGS

The manner by which the above objects and other objects, features, and advantages of the present invention are attained will be apparent from the following detailed description when it is considered in view of the drawings, wherein.

DETAILED DESCRIPTION

Figure 1:
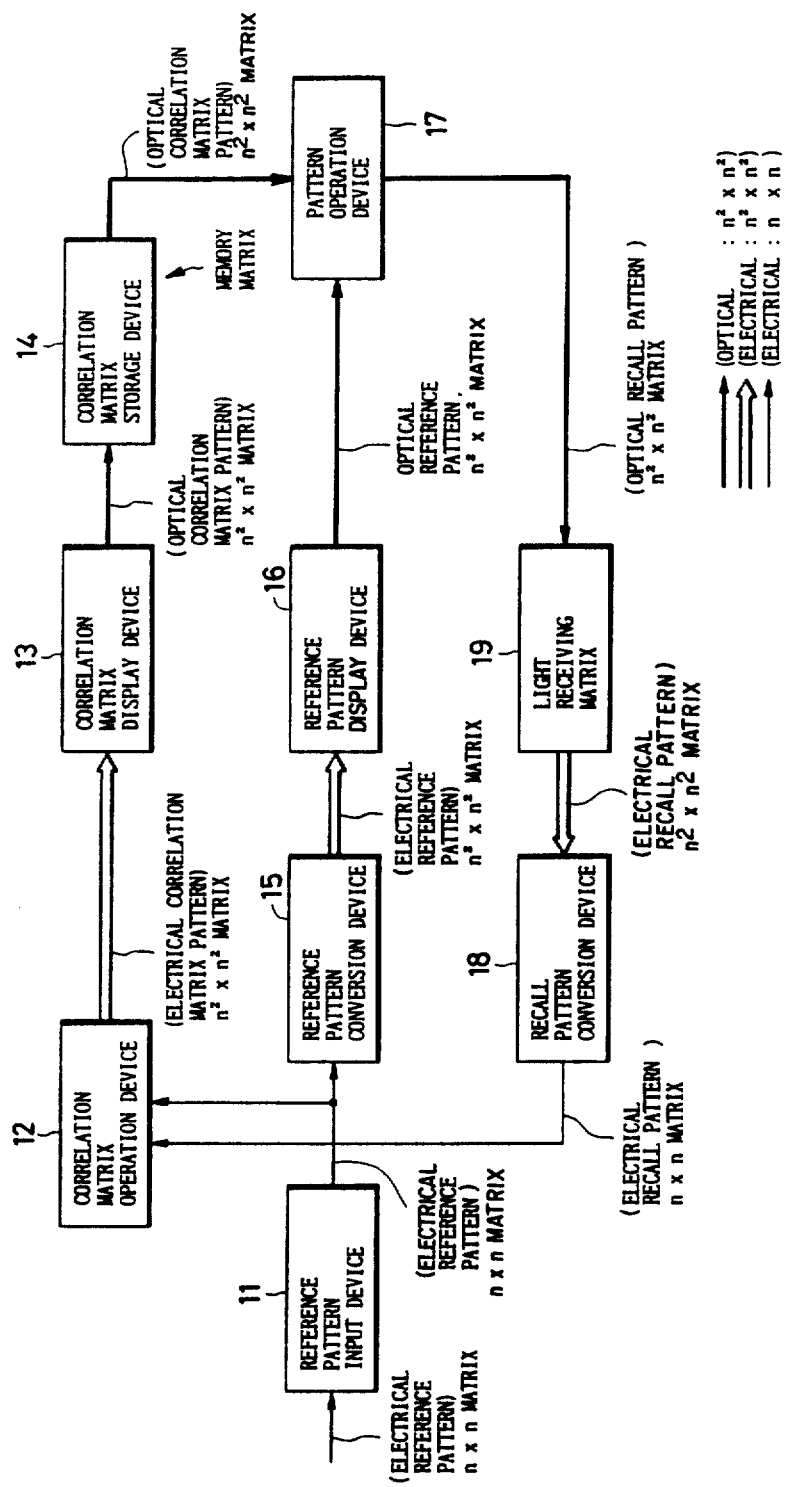
FIG. 1 is a block diagram of an embodiment of an opto-electric hybrid associative memory according to the present invention.

An opto-electric hybrid associative memory according to the present invention converts a correlation matrix pattern, obtained from a reference pattern through electrical operation, into an optical pattern and stores the optical pattern. An optical recall pattern is produced through optical matrix operations on the basis of the optical pattern stored and the reference pattern. The optical recall pattern is converted into an electrical recall pattern, and is fed back with a predetermined learning gain which is the above-mentioned increased separation of stored patterns to produce a correlation matrix pattern from the electrical recall pattern and the auto-correlation of the reference pattern. The correlation matrix of the reference pattern is memorized by repeating sequentially the above-mentioned process.

The opto-electric hybrid associative memory according to the present invention converts the electrical reference pattern into the optical reference pattern, and produces an optical recall pattern through optical matrix operation on the basis of this optical reference pattern and the stored correlation matrix pattern. Thus, a complete pattern can be recalled from an incomplete reference pattern by converting the optical recall pattern into the electrical recall pattern.

The principles of an opto-electric associative memory according to the present invention will first be described as follows. The present invention employs an auto-correlation matrix for implementing associative storage in which a memory matrix is formed through auto-correlation of the content to be stored. The operation in memory is expressed by the following equation:

$$M = \Sigma x \cdot x' \tag{1}$$

where x is an input vector indicative of the content to be stored, x' is the transpose vector of x, and M is a memory matrix. That is, the auto-correlation of the content to be stored is obtained and then M is obtained by adding this auto-correlation over and over again. When recalling information, operating with the storage matrix M permits the recall of an entire information set through the use of only a portion thereof. The recall operation is expressed by the following equation:

$$y = \Phi(M \cdot x) \qquad (2)$$

where y represents an output vector, x an input vector, and Φ a thresholding operation. Even when x is incomplete, i.e., missing some portion of the data, by means of the M·x operation, recall data y close to the original data x can be obtained with the missing portion recovered. Additionally, data having higher than a predetermined level of quality is collected through a thresholding operation represented by Φ, thereby eliminating noise portions.

In recall, in accordance with a memory matrix obtained from Eq. (1) above, the following sequential calculation method is utilized if separation is not sufficient. In the method, the memory matrix is formed for better separation as follows:

$$M_{n+1} = M_n + \alpha(x - \Phi(M_n \cdot x))x' \qquad (3)$$

where α is a learning gain. $M_{n+1}$ is the (n+1)th value of M, and can be obtained by modifying $M_n$ with the correlation between x' and a recall error component. The correlation, called learning pattern, is multiplied by a learning gain α, and the recall error component is the difference between x and $\Phi(M_n \cdot x)$. The learning gain α is selected such that $M_n$ converges. Thus, operating in accordance with Eq. (3) until $M_n$ converges provides the correlation matrix with an improved separation.

Figure 3:
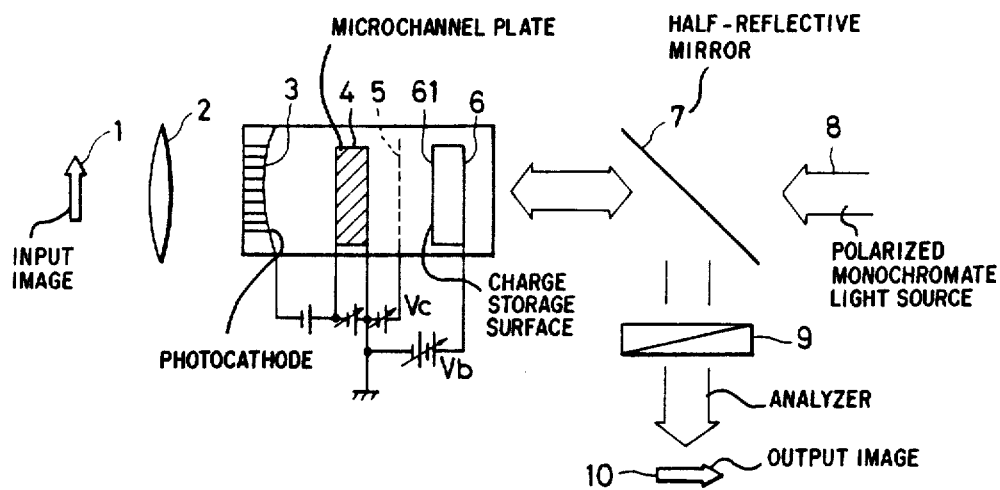
FIG. 3 is a diagram for illustrating an arrangement of a spatial light modulation tube that is a fundamental structural element of the opto-electric hybrid associative memory according to the present invention.

FIG. 3 is a diagram for illustrating the arrangement and operation of a spatial light modulator, which is a fundamental structural element of an opto-electric associative memory according to the present invention. An input image 1 is imaged by a lens 2 onto a photocathode 3. The electrons emitted from the photocathode 3 pass through a microchannel plate 4, a mesh electrode 5, and strike a crystal 6. A half mirror 7 is provided in the optical path between the crystal and a monochromatic light source 8. An output image 10 is formed from light passing through an analyzer 9.

In FIG. 3, the input image 1 incident upon the photocathode 3 of the spatial light modulator through the lens 2 is converted into a photoelectron image. This photoelectron image is amplified at the microchannel plate 4, and forms a charge pattern on the charge storage surface 61 of the crystal 6. The electric field transverse the crystal 6 varies in response to the charge pattern to cause the index of refraction of the crystal 6 to vary due to the Pockels effect. When linearly polarized monochromatic light from the light source 8 is applied to the crystal 6, the light reflected by the charge storage surface 61 is polarized differently due to birefringence of the crystal 6 and the output image 10 will have a light intensity in accordance with the light intensity of the input image 1 if the light reflected by the charge storage surface 6 is allowed to pass through the analyzer 9. The major functions of the spatial light modulation tube associated with the present invention are storage, subtraction, and thresholding, which will described as follows.

(A) Storage function

A spatial light modulation tube provides a storage function for maintaining charge distribution on the surface of an electro-optic crystal for an extended period of time. The crystal 6 exhibits a very high electrical resistance, thus the charge distribution on the charge storage surface 61 can be maintained for more than several days.

(B) Subtraction function

Figure 4:
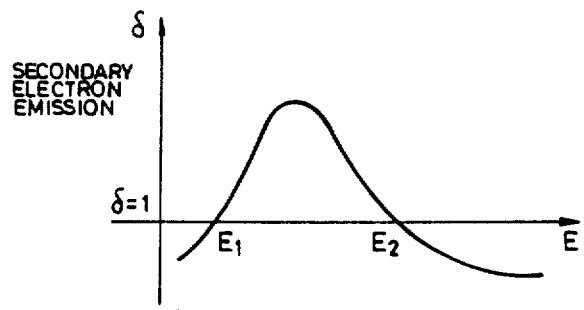
FIG. 4 is a diagram for showing the property of secondary electron emission from the crystal surface of the spatial light modulation tube of FIG. 3.

The spatial light modulation tube can selectively form positive or negative charge distribution on the surface of the electro-optic crystal. FIG. 4 is a graph for showing the property of secondary electron emission of an electro-optic crystal. As shown in FIG. 4, if a primary electron energy E incident upon the charge storage surface 61 is either smaller than a first crossover point E1, or larger than a second crossover point E2, then the crystal surface is negatively charged, since the number of the primary electrons is larger than that of the secondary electrons emitted from the crystal surface (δ<1). If the energy of the primary electrons is between E1 and E2, then the number of the secondary electrons is larger than that of the primary electrons (δ>1) and the crystal surface is positively charged.

Writing data based on positively and negatively charged potential is effected by controlling the voltage of Vc and Vb as shown in FIG. 3. The subtraction function is implemented by either charging the crystal surface negatively and then writing a positive charge on the surface or first charging the crystal surface positively and then writing a negative charge on the crystal surface. The degree of subtraction can be controlled by varying the light intensity when it is incident, varying the duration of the voltage applied to the microchannel plate 4, or varying the magnitude of the voltage applied to the microchannel plate 4.

(C) Thresholding function

When the voltage Vb, shown in FIG. 3, is decreased, the potential of the charge storage surface 61 also decreases. When the potential of the charge storage surface 61 is negative, the electrons cannot reach the surface 61; therefore the write operation is disabled. Thus, thresholding can be effected by controlling the voltage Vb.

An opto-electric associative memory, according to the present invention, to which the aforementioned spatial light modulation tube is applied, will now be described. FIG. 1 is a block diagram showing an embodiment of an opto-electric hybrid associative memory according to the invention, which includes a reference pattern input device 11, a correlation matrix operation device 12, a correlation matrix display device 13, a correlation matrix storage device 14, a reference pattern conversion device 15, a reference pattern display device 16, a pattern operation device 17, a recall pattern conversion device 18, and a light receiving matrix 19.

In FIG. 1, thin lines with arrows and dual lines with arrows indicate the flow of electrical pattern signals. A thick solid line with an arrow indicates the flow of optical pattern signals. An input actor indicative of the contents to be stored or content to be read out, for example an electrical reference pattern that can be formed into an n×n matrix, is input into the reference pattern input device 11. The correlation matrix operation device 12 performs a correlation matrix operation between x and transpose matrix x', or between a recall pattern and x'. The reference pattern conversion device 15 and the recall pattern conversion device 18 perform conversion of the order of the respective matrices and execute thresholding operations. The correlation matrix display device 13 and the reference pattern display device 16 convert an electrical pattern signal into an optical pattern signal. The light receiving matrix 19 converts the optical pattern signal into an electrical pattern signal. The correlation matrix storage device 14 stores a correlation matrix, and the pattern operation device 17 performs an operation on the basis of the reference pattern and a correlation matrix pattern to output the recall pattern.

Operation of the memory will now be described as follows. The operation is carried out in accordance with Eq. (3). The electrical reference pattern to be stored, in the form of an $n \times n$ matrix, is input through the reference pattern input device 11. The correlation operation for the electrical recall pattern and electrical reference pattern is performed in the correlation matrix operation device 12 and the electrical correlation matrix pattern is outputted. This electrical correlation matrix pattern is converted into the optical correlation matrix pattern in the correlation matrix display device 13, which optical correlation matrix pattern is stored in the correlation matrix storage device 14. It should be noted that the auto-correlation matrix of an input electrical reference pattern x represents an electrical correlation matrix pattern y of the type according to equation (2). That is, an equation $y = x \cdot x^t$ is established where $x^t$ is a transpose vector of the input electrical reference pattern x.

The output of the reference pattern input device 11 is also converted into an electrical pattern in the form of an $n^2 \times n^2$ matrix in the reference pattern conversion device 15, and is further converted into the optical reference pattern in the reference pattern display device 16.

In the pattern operation device 17, a multiplication operation is performed between the correlation matrix (optical correlation matrix pattern) from the device 14 and the optical reference pattern from the device 16 to output an optical recall pattern in the form of an $n^2 \times n^2$ matrix. This optical recall pattern is converted into an electrical recall pattern in the form of an $n^2 \times n^2$ matrix in a light receiving matrix 19. This electrical recall pattern is further converted into an electrical recall pattern in the form of an $n \times n$ matrix with thresholding operation in the recall pattern conversion device 18. The electrical recall pattern obtained in this manner and the electrical reference pattern are supplied to the correlation matrix operation device 12. The second component of the Eq. (3) is calculated from the electrical reference pattern and output to the correlation matrix display device 13 and added into the correlation matrix storage device 14. Next, the third component of the Eq. (3) is calculated from the electrical reference pattern and the electrical recall pattern and subtracted from the correlation matrix storage device 14 in the same way. The operation described above is repeated to form the correlation matrix M until the correlation matrix converges.

The recall operation will now be described as follows. The electrical reference pattern is converted into the electrical reference pattern in the form of an $n \times n$ matrix by the reference pattern input device 11, and then is further converted, in the reference pattern conversion device 15, to the electrical reference pattern in the form of an $n^2 \times n^2$ matrix, which in turn is converted into the optical reference pattern in the reference pattern display device 16. In the pattern operation device 17, an operation is performed to produce the optical recall pattern in the form of an $n^2 \times n^2$ matrix on the basis of an optical reference pattern in the form of an $n^2 \times n^2$ matrix and the optical correlation matrix pattern in the form of an $n^2 \times n^2$ matrix. The optical recall pattern thus obtained is converted into the electrical recall pattern in the form of an $n^2 \times n^2$ matrix by the light receiving matrix 19, which matrix is then converted into the electrical recall pattern in the form of an $n \times n$ matrix with thresholding operation in the recall pattern conversion device 18.

An embodiment of the optical system of an opto-electric associative memory according to the present invention will be described with reference to FIG. 2.

Figure 2:
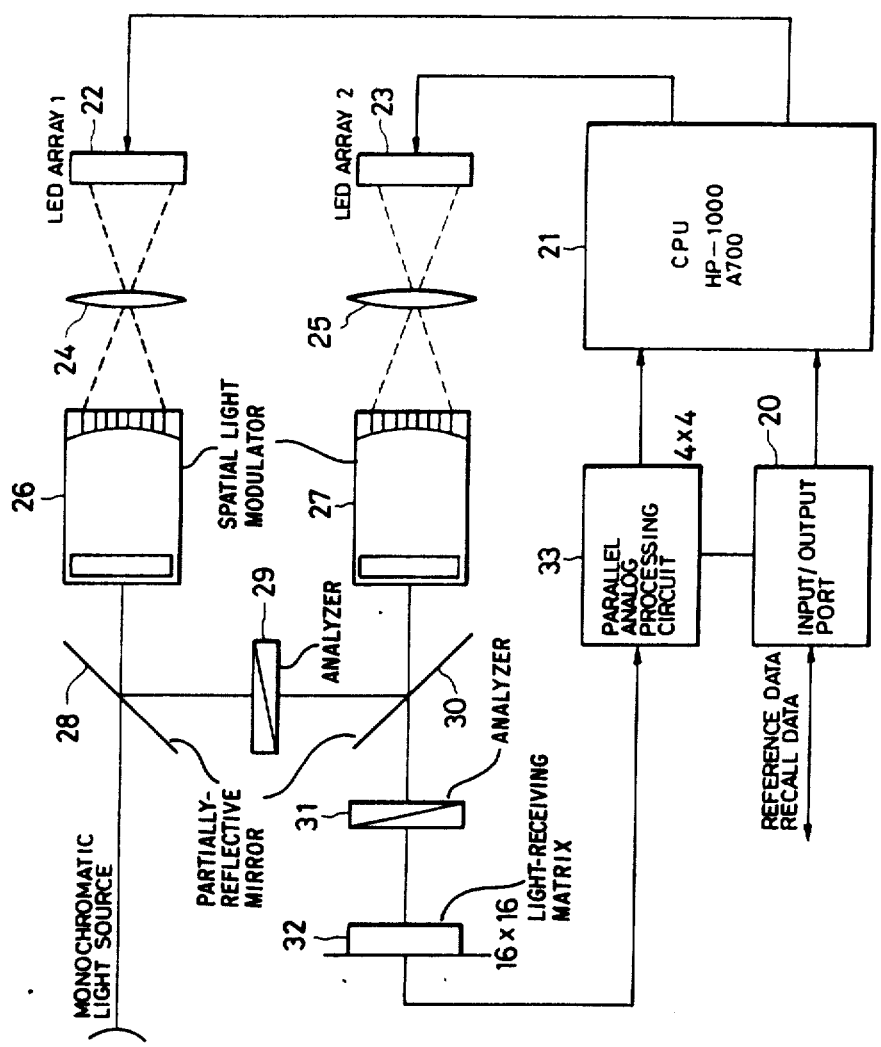
FIG. 2 is a diagram of an embodiment of the actual optical system of the opto-electric hybrid associative memory according to the present invention.

As shown in FIG. 2, the optical system includes an input/output port 20, a CPU 21, LED arrays 22 and 23, lenses 24 and 25, spatial light modulation tubes (modulators) 26 and 27, partially reflective mirrors 28 and 30, analyzers 29 and 31, a light receiving matrix 32, and a parallel analog processing circuit 33. These devices are arranged to act as the corresponding devices in FIG. 1. That is, the CPU 21 is arranged to act as the correlation matrix operation device 12, the reference pattern input device 11, and the reference pattern conversion device 15. The LED array 22 (16×16) and the spatial light modulation tube 26 are arranged to act as the reference pattern display device 16. The LED array 23 (16×16) acts as the correlation matrix display device 13. The spatial light modulation tube 27 acts as the correlation matrix storage device 14. The pattern operation device 17 is implemented by reading the data from the spatial light modulation tube 26 and the spatial light modulation tube 27 successively. The light receiving matrix 32 (PTR (phototransistor) array, 16×16) corresponds to the light receiving matrix 19. The parallel analog processing circuit 33 (4×4) is arranged to act as the recall pattern conversion device 18.

Figure 5:
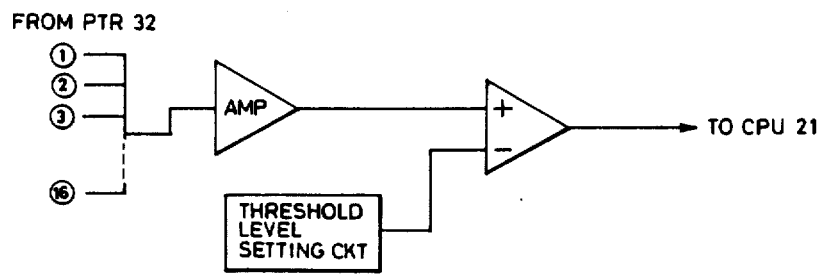
FIG. 5 is a circuit diagram showing an example of a parallel analog processing circuit 33 shown in FIG. 2.

An example of the parallel analog processing circuit 33 is shown in FIG. 5. In FIG. 5, 16 (4×4) input signals from the light-receiving (photoresistor) matrix 32 are received in parallel mode to be summed. The summation signal is amplified to have a sufficient signal level, and is then applied to an operational amplifier where the amplified signal is subjected to comparison with a threshold level. A digital signal representing the comparison result is applied to the CPU 21.

As mentioned above, the opto-electric hybrid associative memory is arranged by combining electronic circuits and optical devices. The following is a description of how an opto-electric hybrid associative storage device operates.

The reference data is read into the CPU 21 through the input/output port 20. The CPU converts the order of the data and the form of the matrix and performs the auto-correlation operation. The CPU outputs the electrical reference pattern to the LED array 22 and the electrical correlation matrix pattern to the LED array 23. The electrical reference pattern and the electrical correlation matrix pattern are converted into the optical reference pattern and the optical correlation matrix pattern, respectively, which are stored in the spatial light modulation tube 26 and the spatial light modulation tube 27 through the lenses 24 and 25, respectively.

The reference pattern stored in the spatial light modulation tube 26 is read by means of a monochromatic light beam, provided through the partially-reflective mirror 28. The light beam reflected by the partially-reflective mirror 28 is imaged on the spatial light modulation tube 27 to read the content stored therein. Through this process, multiplication of the reference pattern by the correlation matrix pattern occurs to produce the optical recall pattern. The recall pattern is converted into the electrical recall pattern in the light receiving matrix 32, after passing through partially-reflective mirror 30 and analyzer 31, and the parallel analog processing circuit 33 converts the order of this matrix and executes a thresholding operation. In this manner, both the electrical recall pattern and the reference pattern are received into the CPU 21. Then, the CPU 21 calculates a recall error component from the electrical recall pattern and the reference pattern, and also calculates the learning pattern from the reference pattern and the recall error component. The CPU 21 outputs the learning pattern to be added into the spatial light modulator 27 by positive charge mode. The negative component of the learning pattern is subtracted from the spatial light modulator 27 by negative charge mode. Thereafter the aforementioned process is repeated to store the optical correlation matrix pattern into the spatial light modulation tube 27.

Operation in recall mode will be described as follows.

The recall data is read into the CPU 21 through the input/output port 20, and the order thereof is converted by the CPU. The recall data is inputted into the spatial light modulation tube 26 from which a reference pattern is read out, as described above, and multiplied by the optical correlation matrix pattern stored in the spatial light modulation tube 27 to obtain the optical recall pattern. The electrical recall pattern is obtained from the optical recall pattern in the light receiving matrix 32. Thus, a complete electrical recall pattern may be obtained from the stored optical correlation matrix pattern and an incomplete electrical reference pattern.

Although the above discussion has been made in connection with an embodiment using a spatial light modulation tube, it should not be interpreted in a limiting sense. Modifications may, of course, be made to the disclosed embodiment by using similar optical devices.

Unlike memory devices for computers such as conventional associative memories that are intended for electrical digital signals, the opto-electric hybrid associative memory according to the invention as described, does not require a scan operation for pattern information. Thus, the present invention reduces significantly the process time required and permits successive outputs. Consequently, applications in the field of optical retrieval devices are made possible.

What is claimed is:

1. An opto-electrical hybrid associative memory comprising:
   a reference pattern input device for receiving and transmitting an electrical reference pattern in the form of an $n \times n$ matrix;
   a correlation matrix operation device for converting an electrical reference pattern in the form of an $n \times n$ matrix from said reference pattern input device into an electrical correlation matrix pattern in the form of an $n^2 \times n^2$ matrix;
   a correlation matrix display device for converting said electrical correlation matrix pattern into an optical correlation matrix pattern in the form of an $n^2 \times n^2$ matrix;
   a correlation matrix storage device for storing said optical correlation matrix pattern displayed by said correlation matrix display device;
   a reference pattern conversion device for converting said electrical reference pattern in the form of an $n \times n$ matrix from said reference pattern input device into an electrical reference pattern in the form of an $n^2 \times n^2$ matrix;
   a reference pattern display device for converting said electrical reference pattern in the form of an $n^2 \times n^2$ matrix from said reference pattern conversion device into an optical reference pattern in the form of an $n^2 \times n^2$ matrix;
   a pattern operation device for producing an optical recall pattern in the form of an $n^2 \times n^2$ matrix by optically multiplying said optical correlation matrix pattern from said correlation matrix storage device and said optical reference pattern output from said reference pattern display device;
   a light receiving matrix for converting said optical recall pattern from said pattern operation device into an electrical recall pattern in the form of an $n^2 \times n^2$ matrix; and
   a recall pattern conversion device for converting said electrical recall pattern in the form of an $n^2 \times n^2$ matrix from said light receiving matrix into an electrical recall pattern in the form of an $n \times n$ matrix and for transmitting the last said electrical recall pattern in the form of an $n \times n$ matrix to said correlation matrix operation device, whereby said electrical recall pattern in the form of an $n \times n$ matrix is obtained from said electrical reference pattern after learning with a plurality of reference patterns through repeated optical processing.

2. An opto-electric hybrid associative memory according to claim 1, wherein said correlation matrix operation device, said reference pattern input device, and said reference pattern conversion device are implemented by a central processing unit.

3. An opto-electric hybrid associative memory according to claim 2, wherein said reference pattern display device comprises a first array of light emitting diodes and a first spatial light modulation tube, together converting said electrical reference pattern in the form of an $n^2 \times n^2$ matrix into said optical reference pattern.

4. An opto-electric hybrid associative memory according to claim 3, wherein said correlation matrix display device comprises a second array of light emitting diodes.

5. An opto-electric hybrid associative memory according to claim 4, wherein said correlation matrix storage device comprises a second spatial light modulator.

6. An opto-electric hybrid associative memory according to claim 5, wherein said pattern operation device comprises means for reading data from the first spatial light modulator into said second spatial light modulator.

7. An opto-electric hybrid associative memory according to claim 6, wherein said reading means comprises:
   first and second half mirrors;
   an image analyzer between said first and second half mirrors; and a source of monochromatic light.

8. An opto-electric hybrid associative memory according to claim 6, wherein said light receiving matrix comprises an array of phototransistors.

9. An opto-electric hybrid associative memory according to claim 8, wherein said recall pattern conversion device comprises a parallel analog processing circuit.

10. An opto-electrical hybrid associative memory storage and retrieval method comprising the steps of:
   inputting through a reference pattern input device an electrical reference pattern in the form of an $n \times n$ matrix;
   forming, in a correlation matrix operation device, an electrical correlation matrix pattern in the form of an $n^2 \times n^2$ matrix from said electrical reference pattern;
   converting, in a correlation matrix display device, said electrical correlation matrix pattern into an optical correlation matrix pattern in the form of an $n^2 \times n^2$ matrix;
   storing said optical correlation matrix pattern displayed by said correlation matrix display device in a correlation matrix storage device;
   converting, in a reference pattern conversion device, said electrical reference pattern from said reference pattern input device into an electrical reference pattern in the form of an $n^2 \times n^2$ matrix;
   converting in a reference pattern display device said electrical reference pattern from said reference pattern conversion device into an optical reference pattern in the form of an $n^2 \times n^2$ matrix;
   producing, in a pattern operation device, an optical recall pattern in the form an $n^2 \times n^2$ matrix by optically multiplying said optical correlation matrix pattern from said correlation matrix storage device and said optical reference pattern outputted from said reference pattern display device;
   converting in a light receiving matrix said optical recall pattern from the pattern operation device into an electrical recall pattern in the form of an $n^2 \times n^2$ matrix; and
   converting in a recall pattern conversion device the electrical recall pattern in the form of an $n^2 \times n^2$ matrix from the light receiving matrix into an electrical recall pattern transmitting said electrical recall pattern in the form of an $n \times n$ matrix to said correlation matrix operation device, whereby said electrical recall pattern in the form of an $n \times n$ matrix is obtained from said electrical reference pattern after learning with a plurality of reference patterns through repeated optical processing.

* * * * *

UNITED STATES PATENT AND TRADEMARK OFFICE
CERTIFICATE OF CORRECTION

PATENT NO. : 4,972,348

DATED : November 20, 1990

INVENTOR(S) : Masatoshi Ishikawa et al.

It is certified that error appears in the above-identified patent and that said Letters Patent is hereby corrected as shown below:

On the Title page

Item[75], Inventors, Change "Shizouka" to --Shizuoka--;

Claim 1, Column 8, line 31, Delete "the last";

Claim 10, Column 10, line 20, before "transmitting" insert --in the form of an nxn matrix and--.

Signed and Sealed this

Twenty-third Day of February, 1993

*Attest:*

STEPHEN G. KUNIN

*Attesting Officer*     *Acting Commissioner of Patents and Trademarks*